US010093086B2

(12) United States Patent
Landru et al.

(10) Patent No.: US 10,093,086 B2
(45) Date of Patent: *Oct. 9, 2018

(54) METHOD FOR SEPARATING AT LEAST TWO SUBSTRATES ALONG A SELECTED INTERFACE

(71) Applicant: Soitec, Bernin (FR)

(72) Inventors: Didier Landru, Champ Pres Froges (FR); Christophe Figuet, Crolles (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/256,265

(22) Filed: Sep. 2, 2016

(65) Prior Publication Data

US 2016/0368259 A1 Dec. 22, 2016

Related U.S. Application Data

(63) Continuation of application No. 14/424,311, filed as application No. PCT/IB2013/001937 on Sep. 4, 2013, now Pat. No. 9,437,473.

(30) Foreign Application Priority Data

Sep. 7, 2012 (FR) ...................................... 12 58403

(51) Int. Cl.
*H01L 21/762* (2006.01)
*H01L 21/67* (2006.01)
(Continued)

(52) U.S. Cl.
CPC ........ *B32B 43/006* (2013.01); *H01L 21/2007* (2013.01); *H01L 21/67092* (2013.01);
(Continued)

(58) Field of Classification Search
CPC ................................................. H01L 21/76843
See application file for complete search history.

(56) References Cited

U.S. PATENT DOCUMENTS 6,291,313 B1   9/2001   Henley et al.
6,959,863 B2   11/2005  Figuet et al.
(Continued)

FOREIGN PATENT DOCUMENTS

CN   1255237 A   5/2000
CN   1648632 A   8/2005
(Continued)

OTHER PUBLICATIONS

U.S. Appl. No. 14/424,311.*
(Continued)

*Primary Examiner* — Moazzam Hossain
*Assistant Examiner* — Hajar Kolahdouzan
(74) *Attorney, Agent, or Firm* — TraskBritt

(57) ABSTRACT

A process for separating at least two substrates comprising at least two separation interfaces along one of the interfaces includes, before inserting a blade between the substrate, damaging at least one portion of a peripheral region of a chosen one of the interfaces, then inserting the blade and partially parting the substrates, and applying a fluid in a space between the parted substrates while the blade remains inserted therebetween, and decreasing a rupture energy of the chosen interface by stress corrosion involving breaking of siloxane bonds present at the interface.

20 Claims, 2 Drawing Sheets

(51) Int. Cl.
  *B32B 43/00* (2006.01)
  *H01L 21/20* (2006.01)
  *H01L 21/683* (2006.01)

(52) U.S. Cl.
  CPC .... *H01L 21/6835* (2013.01); *H01L 21/76251* (2013.01); *H01L 2221/6834* (2013.01); *H01L 2221/68381* (2013.01)

(56) References Cited

U.S. PATENT DOCUMENTS

| | | | |
|---|---|---|---|
| 7,387,953 | B2 | 6/2008 | Figuet |
| 7,713,369 | B2 | 5/2010 | Aspar et al. |
| 7,892,951 | B2 | 2/2011 | Landru et al. |
| 8,084,784 | B2 | 12/2011 | Figuet et al. |
| 8,507,332 | B2 | 8/2013 | Riou et al. |
| 8,513,092 | B2 | 8/2013 | Landru |
| 8,575,010 | B2 | 11/2013 | Drouin et al. |
| 8,623,740 | B2 | 1/2014 | Landru et al. |
| 2004/0104272 | A1 | 6/2004 | Figuet et al. |
| 2004/0245521 | A1 | 12/2004 | Faris |
| 2006/0211230 | A1 | 9/2006 | Figuet |
| 2008/0142844 | A1 | 6/2008 | Aulnette et al. |
| 2009/0111243 | A1 | 4/2009 | Landru et al. |
| 2010/0164048 | A1 | 7/2010 | Figuet et al. |
| 2010/0264463 | A1 | 10/2010 | Figuet et al. |
| 2011/0024868 | A1 | 2/2011 | Drouin et al. |
| 2011/0165758 | A1 | 7/2011 | Bourdelle et al. |
| 2011/0177673 | A1 | 7/2011 | Landru |
| 2011/0183493 | A1 | 7/2011 | Daval et al. |
| 2011/0207295 | A1 | 8/2011 | Landru et al. |
| 2011/0266651 | A1 | 11/2011 | Riou et al. |
| 2012/0252162 | A1 | 10/2012 | Sadaka et al. |
| 2012/0329243 | A1 | 12/2012 | Letertre et al. |
| 2014/0183601 | A1 | 7/2014 | Lallement et al. |
| 2014/0326416 | A1 | 11/2014 | Landru |
| 2014/0339681 | A1 | 11/2014 | Figuet et al. |
| 2014/0357093 | A1 | 12/2014 | Landru et al. |

FOREIGN PATENT DOCUMENTS

| | | |
|---|---|---|
| CN | 1826433 A | 8/2006 |
| CN | 1910035 A | 2/2007 |
| CN | 102501565 A | 6/2012 |
| WO | 2006093817 A2 | 9/2006 |

OTHER PUBLICATIONS

Maszara et al., Bonding of Silicon Wafers for Silicon-on-Insulator, J. Appl. PHys., vol. 64, No. 10, Nov. 15, 1988, pp. 4943-4950.

Bagdahn et al., Chapter 14, Debonding of Wafer-Bonded Interfaces for Handling and Transfer Applications in Wafer Bonding: Applications and Technology.

Cha et al., in Why debonding is useful in SOI?, Electrochemical Society Proceedings, vol. 99-35, pp. 119-128.

International Written Opinion for International Application No. PCT/IB2013/001937 dated Aug. 28, 2014, 6 pages.

International Search Report for International Application No. PCT/IB2013/001937 dated Aug. 28, 2014, 3 pages.

International Preliminary Report on Patentability for International Application No. PCT/IB2013/001937 dated Mar. 10, 2015, 7 pages.

Chinese First Office Action from Chinese Application No. 201380046291.1, dated Jul. 26, 2016, 8 pages.

Chinese Search Report from Chinese Application No. 201380046291.1, dated Jul. 6, 2016, 1 page.

Japanese First Office Action from Japanese Application No. 2015530504, dated Jun. 13, 2017, 4 pages.

\* cited by examiner

METHOD FOR SEPARATING AT LEAST TWO SUBSTRATES ALONG A SELECTED INTERFACE

CROSS-REFERENCE TO RELATED APPLICATIONS

This application is a continuation of U.S. patent application Ser. No. 14/424,311, filed Feb. 26, 2015, now U.S. Pat. No. 9,437,473, issued Sep. 6, 2016, and which is a national phase entry under 35U.S.C. § 371 of International Patent Application PCT/IB2013/001937, filed Sep. 4, 2013, designating the United States of America and published in English as International Patent Publication WO 2014/037792 A2 on Mar. 13, 2014, which claims the benefit under Article 8 of the Patent Cooperation Treaty and under 35 U.S.C. § 119(e) to French Patent Application Serial No. 1258403, filed Sep. 7, 2012, the disclosure of each of which is hereby incorporated herein in its entirety by this reference.

TECHNICAL FIELD

This disclosure relates to a process for separating a structure comprising two assembled substrates, one at least of these two substrates being intended to be used in electronics, optics, optoelectronics and/or photovoltaics, the separation taking place along one interface present in the structure, referred to as a separation interface.

BACKGROUND

One particular case of such a structure is a debondable structure, in which the separation interface is an interface along which bonding via molecular adhesion has been carried out.

The expression "bonding via molecular adhesion" denotes bonding via intimate contact of the surfaces of the two substrates, employing adhesion forces, mainly van der Waals' forces, and not using an adhesive layer.

Without wishing to be limiting, it may, however, be considered that a debondable structure may be used mainly in four different applications:

a) Bonding of a mechanical stiffener: It may be desirable to bond a mechanical stiffener to a weak substrate or thin layer in order to prevent damaging or breaking it during certain fabrication steps, then to be able to remove this mechanical stiffener when its presence is no longer needed.

b) Rectifying poor bonding: Debonding makes it possible to debond two substrates that might not have been correctly bonded a first time, then to rebond them after cleaning, in order to improve the profitability of a fabrication process and to avoid, for example, scrapping poorly bonded substrates.

c) Temporary protection: During certain steps of storing or transporting substrates, especially in plastic boxes, it may be useful to temporarily protect their surfaces, especially those intended to be used subsequently for the fabrication of electronic components, in order to avoid any risk of contamination. One simple solution comprises bonding two substrates so that the faces thereof to be protected are bonded, respectively, to one another, then debonding these two substrates during the final use thereof.

d) Double transfer of a layer: This comprises producing a reversible bonding interface between an active layer and a first support substrate (optionally made of an expensive material), then transferring this active layer to a second final substrate by debonding the reversible bonding interface.

However, applications may also be found in which it is desired to separate a structure formed of two assembled substrates along an interface that is not a bonding interface.

Such an interface may be, for example, an interface between a first material and a second material, which may have been joined to one another by an addition of the second material to the first, for example, via deposition, epitaxy, etc.

As a variant, such an interface may be, for example, a weak zone formed within a material and marked by the presence of bubbles, inclusions, etc. Separation along an interface that is not a bonding interface may, in particular, find an application in the transfer of a layer from a first substrate to a second substrate.

The layer to be transferred may thus not have been formed by bonding to the first substrate but, for example, may be formed by epitaxy or deposition on the substrate, or, alternatively, may be part of a thicker layer within which it has been delimited by a layer of bubbles that weakens the thick layer.

Irrespective of the envisaged applications, it is necessary to carry out the separation without damaging, scratching or contaminating the surface of the two substrates located on either side of the separation interface and without breaking these two substrates.

Depending on the various applications, these two "substrates to be separated" may be two layers of one and the same substrate or two different substrates.

Moreover, the larger the dimensions of the two substrates of the structure to be separated or the higher their bond energy, the more difficult the separation is to carry out, in particular, without damage.

Furthermore, it is known from the research studies by Maszara regarding the measurement of the bonding energy between two substrates (see the article by W. P. Maszara, G. Goetz, A. Caviglia and J. B. McKitterick: *J. Appl. Phys.* (1988), 64:4943) that it is possible to measure the bonding energy between two substrates by introducing a thin blade between the two at their bonding interface.

Maszara established the following relationship:

$$L = \sqrt[4]{\frac{3Et^3d^2}{32\gamma}}$$

in which d represents the thickness of the blade inserted between the two bonded substrates, t represents the thickness of each of the two bonded substrates, E represents the Young's modulus along the debonding axis, γ represents the bonding energy and L represents the length of the crack between the two substrates at equilibrium.

The above formula starts from the hypothesis that the two substrates are of identical dimensions.

Owing to the aforementioned relationship, it is possible, by measuring L, to determine the bonding energy γ.

This definition of the "bonding" energy is based on the hypothesis that the energy needed to separate the two substrates, or rupture energy of the interface (which is the energy actually measured by the method using a blade), is equal to the bonding energy of the substrates.

In reality, during the separation of the substrates, a portion of the energy is dissipated, not in the rupture of the interface itself, but in other phenomena, such as deformations of the material(s) present at the interface.

In the remainder of the text, the rupture energy of an interface will, therefore, denote the energy to be provided in order to separate two substrates or layers along the interface.

Insofar as these substrates or layers to be separated are stiff enough to be separated with a blade, it is possible to separate them by parting them sufficiently from one another at their beveled edge, which has the effect of creating a separation wave. This wave propagates from the point of the edge of the substrates where it is initiated, across the entire surface of these substrates.

Furthermore, the separation is known to be assisted by the phenomenon referred to as stress corrosion.

Stress corrosion comprises, in combination with the parting force of the blade, the application of a fluid to the separation interface.

Stress corrosion is particularly beneficial when at least one of the substrates is made of silicon and when the interface comprises silicon oxide, whether it is a native oxide or an oxide formed intentionally, for example, in order to form a bonding layer or an insulating layer.

This is because such an interface contains siloxane (Si—O—Si) bonds that are broken by water molecules provided by the fluid.

The rupture energy of the interface is thus significantly reduced.

For the description of the stress corrosion process, reference may be made to chapter 14, entitled "Debonding of Wafer-Bonded Interfaces for Handling and Transfer Applications" by J. Bagdahn and M. Petzold, in *Wafer Bonding: Applications and Technology*, edited by M. Alexe and U. Gösele, Springer, 2004.

In particular, Cha et al., in "Why debonding is useful in SOI?," *Electrochemical Society Proceedings*, Vol. 99-35, pp. 119-128, propose a two-step separation comprising partially parting the substrates by means of a blade, then introducing deionized water into the space thus formed until the complete separation of the substrates is achieved.

However, in certain applications, the interface along which it is desired to carry out the separation has a very high rupture energy, for example, greater than 1 $J/m^2$, or even greater than 1.5 $J/m^2$.

Such is the case, for example, for a structure of silicon-on-insulator (SOI)-type, or more broadly, for a structure of semiconductor-on-insulator (SeOI)-type, which comprises a support substrate, a buried dielectric layer (for example, an oxide layer) and a semiconductor layer (of silicon in the case of an SOI).

When this structure is produced by layer transfer, that is to say, by assembling a donor substrate comprising the semiconductor layer and a support substrate, the dielectric layer being at the interface, a heat treatment is generally carried out that aims to increase the rupture energy at the interface.

This makes it possible to prevent the structure from separating during the transfer of the semiconductor layer during subsequent SOI treatment steps.

By way of example, it is thus possible to attain a rupture energy of the order of 1.6 $J/m^2$ at the interface.

However, due to this very high rupture energy, if an attempt is made to insert a blade in order to separate the semiconductor layer, there is a high risk of breaking the layer instead of separating it along the interface.

U.S. Pat. No. 7,713,369 proposes a process for fabrication of a detachable structure consisting of the assembly of two substrates, in which a peripheral zone having a high rupture energy and a central zone having a low rupture energy are formed at the interface, here, a bonding interface.

Thus, in order to separate the two substrates, the peripheral zone is removed by chemical etching or with the aid of a laser, until the central zone is reached, at which time it is possible to carry out a mechanical separation (for example, using a pressurized water or air jet, by pulling or by insertion of a blade).

However, the formation of these two zones of differing rupture energies on one and the same interface is restrictive to implement.

Furthermore, certain structures may comprise several interfaces, the separation of the substrates necessarily taking place at the interface that has the lowest rupture energy. This interface, predefined by its technical features, may not be that which a user would have chosen in order to carry out the separation of the substrates at the desired location.

One objective of the disclosure is, therefore, to propose a separation process that makes it possible to separate two assembled structures, along one interface chosen from among others, the interfaces having very high bond energies, which are identical or different, without the risk of fracturing or damaging the substrates.

BRIEF SUMMARY

In accordance with the disclosure, a process is proposed for separating at least two substrates contained in a structure (S), the structure comprising at least two separation interfaces extending parallel to the main faces of the structure along one interface selected from the interfaces, at least one of these two substrates being intended to be used in electronics, optics, optoelectronics and/or photovoltaics, the separation being carried out by inserting a blade between the substrates and applying a parting force, via the blade, for parting the two substrates, the process comprising:

an interface is chosen for the separation that is sensitive to stress corrosion, that is to say, to the combined action of the separation force and of a fluid capable of breaking siloxane (Si—O—Si) bonds present at the interface, before inserting the blade, at least one portion of a peripheral region of the chosen interface comprising the insertion region of the blade is damaged, so that the rupture energy in the peripheral region is lower than that of the other interfaces in the insertion region of the blade, thus making it possible to initiate the parting of the substrates along the chosen interface in the damaged region, then a fluid is applied in the space between the parted substrates while the blade remains inserted, so as to decrease the rupture energy of the chosen interface by stress corrosion.

In the present text, the term "substrate" covers a single-layer or multilayer substrate, the periphery of which has a bevel, against which a blade may bear in order to part two bonded substrates. Furthermore, a substrate may itself contain one or more interfaces.

A "separation interface" is defined in the present text as being a physical boundary between two layers, along which a separation wave may propagate.

It is understood that the two layers in question may be made of two different materials, it being possible for the materials to be joined by any type of introduction of one material onto the other (especially epitaxy, deposition, bonding, oxidation, especially thermal oxidation), or else may form two parts of a thicker layer, delimited by a weak zone (in particular, containing bubbles, inclusions, etc.).

According to one embodiment, the peripheral region of the chosen interface is in the form of a ring.

According to one embodiment of the disclosure, the peripheral region having a lower rupture energy is formed prior to the assembly of the two substrates.

Alternatively, the peripheral region having a lower rupture energy is formed after the assembly of the two substrates.

According to one embodiment, the peripheral region is formed by laser irradiation of the chosen interface.

According to one embodiment, the peripheral region is formed by chemical etching of the chosen interface.

For example, chemical etching is carried out by applying hydrofluoric acid.

According to one advantageous application of the disclosure, the structure comprises a structure of semiconductor-on-insulator type comprising a support substrate, a buried silicon oxide layer and a silicon layer, the separation interface consisting of the interface between the oxide layer and the silicon layer.

The rupture energy of each of the separation interfaces may be greater than $1$ $J/m^2$, preferably greater than $1.5$ $J/m^2$.

Preferably, the rupture energy in the peripheral region of the chosen separation interface is less than or equal to $1$ $J/m^2$.

On the other hand, the rupture energy in the remainder of the separation interface may be greater than or equal to $1$ $J/m^2$, preferably greater than or equal to $1.5$ $J/m^2$.

According to one particular embodiment, the chosen interface is a silicon/silicon oxide interface.

The fluid applied between the substrates is advantageously selected from deionized water, ethanol, water vapor, aqueous ammonia and hydrazine.

BRIEF DESCRIPTION OF THE DRAWINGS

Other features and advantages of the disclosure will emerge from the detailed description that follows, with reference to the appended drawings in which.

DETAILED DESCRIPTION

Figure 1:
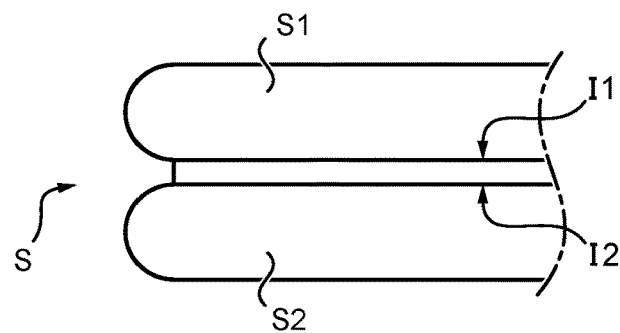
FIG. 1 is a cross-sectional view of a structure to be separated.

With reference to FIG. 1, a structure S to be separated comprises two substrates S1 and S2.

At least one of these substrates is intended to be used in electronics, optics, optoelectronics and/or photovoltaics.

The structure S furthermore comprises two separation interfaces I1, I2 respectively having rupture energies γ1, γ2 (expressed in $J/m^2$).

As mentioned above, at least one of the interfaces I1 and I2 may be a bonding interface, while the other interface is an interface of another type (for example, resulting from epitaxy, deposition, etc.).

Alternatively, the interfaces I1 and I2 may both be bonding interfaces.

For example, the substrates S1 and S2 may have been bonded along the interface I2, while the interface I1 is an interface formed during the epitaxy of a material on a support, the material and the support together forming the substrate S1.

It is considered that the separation must take place along the interface I1.

Naturally, the structure S could comprise more interfaces without departing from the scope of the present disclosure. The teaching relating to the interface I2 will then be applied to each of the other interfaces.

The interface I1 is advantageously an interface susceptible to stress corrosion.

More specifically, the chosen materials on either side of the interface I1 generate siloxane bonds, which are capable of being broken by a fluid under the action of a parting force for parting the substrates S1 and S2.

The materials on either side of the interface I1 may be identical or different, as long as there are siloxane bonds between the materials.

The interfaces that contain such siloxane bonds are interfaces that involve, in particular, silicon oxide ($SiO_2$), whether it is native or formed intentionally on a support (by deposition, oxidation, etc.), silicon, when it is assembled by a hydrophilic bonding, and/or silicon oxynitrides.

There are very many means for generating an interface comprising siloxane bonds including, in particular, the processes of bonding, of deposition of an oxide layer, of oxidation of the silicon, of treatment of the silicon with oxygen plasma, or else of implantation of oxygen.

Thus, the interface I1 may be a bonding interface, that is to say, along which two materials have been bonded via molecular adhesion during the fabrication of one of the substrates S1, S2 or of the structure S.

For example, the interface I1 may be formed by bonding two layers of silicon, each covered with a native oxide layer via which they are in contact.

As a variant, the interface I1 may be formed by bonding one layer of silicon, optionally covered with a native oxide layer, and one layer of silicon oxide.

Alternatively, the interface I1 may be formed by a technique other than bonding.

For example, the interface I1 may be formed by weakening a layer of a material containing siloxane bonds, for example, by ion implantation or laser illumination.

Furthermore, according to one advantageous embodiment of the disclosure, the interface I1 has a high rupture energy, that is to say, a rupture energy greater than or equal to $1$ $J/m^2$, preferably greater than or equal to $1.5$ $J/m^2$.

The Maszara method mentioned above for measuring the bonding energy may be applied more generally to the measurement of the rupture energy of an interface.

With regard to the other interface I2, along which it is desired that the separation does not take place, it may or may not be sensitive to stress corrosion.

Furthermore, this other interface I2 advantageously has a high rupture energy that is either higher or lower than the rupture energy of the interface I1 chosen for carrying out the separation.

Before carrying out the separation of the structure S, it is ensured that the interface I1 is weakened in a peripheral region comprising the blade insertion region.

This weakening (which results in a localized reduction of the rupture energy, making it possible, for example, to attain a rupture energy of less than or equal to $1$ $J/m^2$) is obtained by localized damaging at the periphery of the interface I1.

Figure 2A:
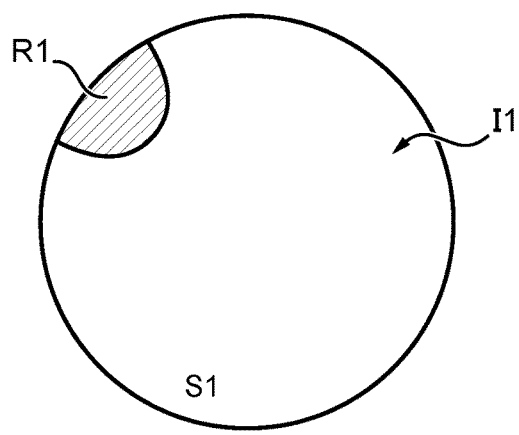
FIGS. 2A and 2B illustrate, as top views, two methods of damaging the interface.
Figure 2B:
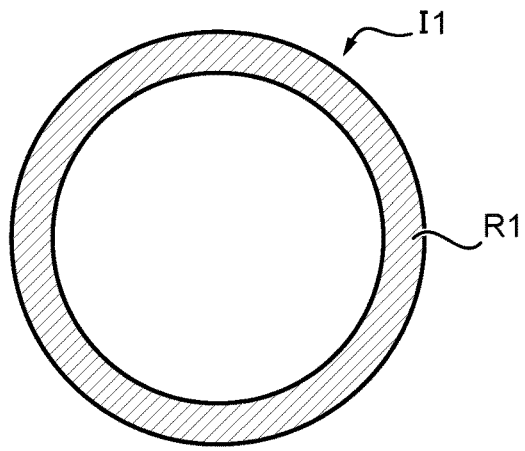

According to one embodiment, illustrated in FIG. 2A, a damaged region R1 of the interface I1 is within a sector of a peripheral ring of the interface I1.

Preferably, the angular amplitude of this sector is between 2° and 30°.

According to another embodiment, the damaged region R1 of the interface I1, the width of which in the radial direction is preferably between 0.3 mm and 10 mm, is in the form of a peripheral ring.

Various treatments make it possible to damage the region R1 of the chosen interface I1.

A person skilled in the art will be able to choose to carry out the chosen treatment before or after the assembly of the substrates S1, S2 forming the structure S, in particular, by taking into account the practical conditions for carrying out the process for fabrication of the structure S.

Advantageously, the treatment is carried out before the formation of the structure S; the disclosure thus makes it possible to separate a structure S, even if its fabrication process does not contain any step dedicated to the localized damaging of the interface I1.

According to one embodiment, the damaging of the region R1 is obtained by laser irradiation of the chosen interface I1.

The laser beam is chosen so as to selectively heat the interface I1 to be weakened, causing damaging of the interface I1, and consequently the reduction of its rupture energy.

This damaging may be, for example, the thermal decomposition of a material present at the interface I1 to give a gas phase.

Such is the case, in particular, when one of the materials present at the interface I1 is a polymer or a ceramic.

Alternatively, the damaging of the region R1 is obtained by chemical etching of the chosen interface I1.

Chemical etching is carried out by means of an etchant that makes it possible to selectively etch one of the materials present at the interface I1, without etching the materials present at the interface I2.

A person skilled in the art is able to select the appropriate etchant as a function of the nature of the materials of the interface I1.

The application of ultrasonic waves may also be envisaged for locally reducing the rupture energy of the interface I1.

Irrespective of the damaging treatment chosen, at the end of this treatment, the rupture energy in the region R1 of the interface I1 is lower than the rupture energy in the remainder of the interface I1, and may be considered to be a low enough rupture energy so as not to risk causing fracture of the substrates S1, S2 during the insertion of the blade and the start of separation.

Furthermore, the rupture energy of the interface I1 in the region R1 is lower than the rupture energy of the interface I2, at least in the region provided for the insertion of the blade.

This makes it possible to ensure that, during the insertion of the blade, the start of separation indeed takes place along the interface I1 (which locally has the lowest rupture energy) and not along the interface I2.

Figure 3A:
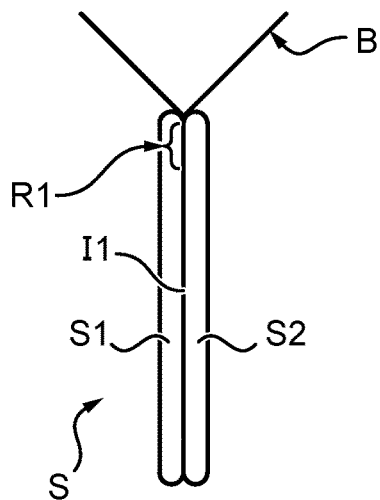
FIGS. 3A and 3B illustrate the successive steps of separating the structure.

With reference to FIG. 3A, the separation comprises inserting a blade B, preferably that is thick, between the two substrates S1, S2 of the structure S, from the periphery thereof, and in applying a parting force to the bevels of the substrates S1, S2.

The term "thick" is understood to mean that the blade B enables a sizeable parting of the substrates S1, S2, so as to enable the physical separation thereof without coming into contact with the front faces (i.e., the faces of the substrates S1, S2 located at the interface I1) in order to avoid damaging them.

Furthermore, the blade B must be inserted between the substrates S1, S2 along a plane parallel to the plane of the separation interface.

During the separation and in order to avoid any rupture of the substrates S1, S2, the substrates S1, S2 are held by a support arranged so that at least one of the substrates is capable of being deformed.

Thus, according to one preferred embodiment, the structure S is positioned vertically in a separation device that comprises, in its lower part, a structure-holding member and, in its upper part, a separation member comprising the blade B that can move vertically in translation in the axis of the holding member.

The holding member comprises a groove that has a base and inclined edges on either side of the base. The base of the groove is wide enough to receive the assembled structure without exerting stress thereon, while the edges are high enough to prevent the substrates S1, S2 from falling out after their separation.

Figure 3B:
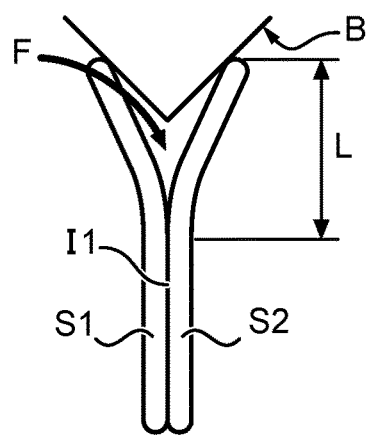

The displacement of the blade B in the direction of the inside of the structure causes a wedge effect and the parting of the two portions thereof along the interface I1 (see FIG. 3B, in which the interface I2 has not been represented).

This parting of the two portions over a length L has the effect of initiating the formation of a separation wave.

After the parting of the substrates S1, S2 has started, a fluid F that promotes stress corrosion is applied in the space between the substrates S1, S2.

Under the combined effect of this fluid F and the parting force exerted by the blade B, the siloxane bonds of the interface I1 break, which results in a significant reduction in the rupture energy of the interface I1.

In particular, the rupture energy becomes low enough to prevent any risk of the substrates S1, S2 breaking during application of the parting force.

Advantageously, the structure S is held in a vertical position during the separation.

This is because this position favors the flow of the fluid F used for the stress corrosion along the interface I1.

In this case, the blade B is preferably vertically oriented and introduced at the top of the structure S so that the separation wave moves downward, becoming horizontal as it moves away from the insertion point of the blade B.

Among the fluids that promote stress corrosion, non-limiting mention may be made of deionized water, ethanol, water vapor, aqueous ammonia and hydrazine.

The fluid F may be introduced between the substrates S1, S2 in various ways.

Thus, according to one embodiment, the structure S may be partially submerged in a bath of the fluid F promoting stress corrosion.

Alternatively, the fluid F may be sprayed, preferably continuously, onto the structure S, in particular, at the blade insertion region, once the blade B has been introduced between the substrates S1, S2.

In the case where the interface I2 is also sensitive to stress corrosion, it is important to initiate the opposite, "dry" separation, i.e., separation in the absence of any fluid that promotes stress corrosion in the blade insertion region, and wait for the separation to be started in order to bring the chosen interface into contact with the fluid that promotes stress corrosion.

This is because, if the various interfaces sensitive to stress corrosion were brought into contact with the fluid in the blade insertion region, as soon as the blade was inserted, the fluid would have the effect of reducing the rupture energy of each of these interfaces, thus leading to an equalizing of the rupture energies of the interfaces.

On the other hand, dry initiation makes it possible to prevent such equalizing and to initiate the separation along the chosen interface, which has, at least locally, the lowest rupture energy.

Once the separation is started, bringing the chosen interface I1 into contact with a fluid that promotes stress corrosion makes it possible to facilitate and accelerate the separation by reducing the rupture energy of the interface.

The insertion of the blade in the presence of the fluid is continued until the substrates are completely separated.

The disclosure is particularly suitable for separation along interfaces of silicon/silicon oxide type, and for any other interface that is sensitive to stress corrosion and that has a high rupture energy.

The separation described above may be obtained on structures of all dimensions.

In particular, the structure may consist of substrates of large diameter, for example, having a diameter of 300 mm.

Exemplary Embodiment

Figure 4:
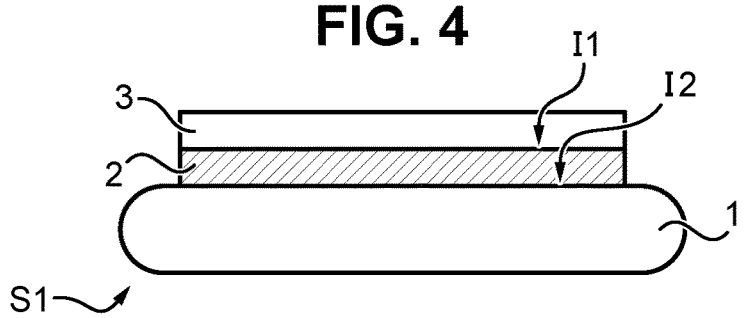
FIG. 4 is a structure of silicon-on-insulator type that may be separated according to one exemplary embodiment of the disclosure.

FIG. 4 illustrates a substrate S1 to be separated, the substrate being a structure of silicon-on-insulator (SOI) type.

The substrate S1 successively comprises a support substrate 1, a buried silicon oxide layer 2, sometimes denoted by the term "BOX" (acronym for "Buried OXide"), and a thin silicon layer 3, referred to as an active layer, which is generally intended to receive components for electronics, optics, optoelectronics and/or photovoltaics.

The processes that enable the fabrication of such a substrate are well known to a person skilled in the art.

Mention will especially be made of layer transfer processes and, more particularly, of the SMART CUT® process.

According to one exemplary embodiment, the SMART CUT® process typically comprises:
  the provision of a donor substrate comprising the layer of silicon to be transferred to the support substrate;
  the formation of an oxide layer at the surface of the donor substrate (for example, by thermal oxidation);
  the introduction of atomic species (for example, by implantation) into the donor substrate, so as to create a weakened zone that delimits the layer of silicon to be transferred to the support substrate;
  the bonding via molecular adhesion of the oxide layer to the support substrate;
  the breaking of the donor substrate along the weakened zone, resulting in the transfer of the layer of silicon to the support substrate;
  optional steps for finishing the transferred layer of silicon (annealing, polishing, etc.).

The substrate S1, therefore, comprises two interfaces: the interface I1 between the silicon layer 3 and the oxide layer 2 (which is an interface resulting from the oxidation of the silicon), and the interface I2 between the oxide layer 2 and the support substrate 1 (which is a bonding interface).

The silicon/oxide interface I1 has a high rupture energy, of the order of 1.6 J/m$^2$.

The energy of this interface I1 may be locally reduced so as to be lower than the rupture energy of the interface I2 in the region R1 (see FIG. 3A) of the start of the separation.

For example, it is possible to locally weaken the interface I1 by laser irradiation or by an ultrasound treatment.

Figure 5:
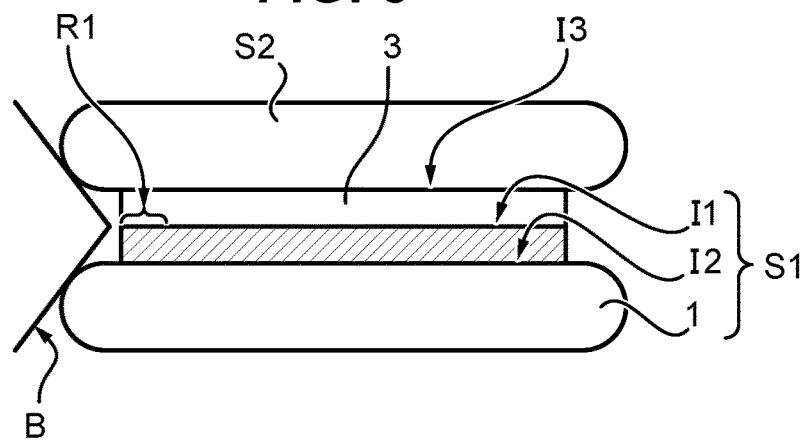
FIG. 5 illustrates the insertion of the blade with a view to separating the structure from FIG. 4.

As illustrated in FIG. 5, the substrate S1 is bonded, by means of the thin layer 3, to a second substrate S2, which provides a second support bevel for the blade B used for the separation. A third interface I3 is thus formed between the thin layer 3 and the substrate S2.

The rupture energy of interface I3 is chosen so as to be greater than the rupture energy of the interface I1 in the region R1, in order to prevent, during the insertion of the blade B, the separation from taking place along the interface I3.

The insertion of the blade B between the substrates S1 and S2, in the damaged region R1 of the interface I1, makes it possible to start the separation along interface I1, then deionized water is applied, for example, by spraying, in the space between the substrates S1 and S2, until the two substrates are completely detached.

This method, therefore, makes it possible to detach the active layer of an SOI, even when no steps have been taken during its fabrication in order to make it detachable.

What is claimed is:

1. A method for separating at least two substrates forming part of a structure comprising at least two separation interfaces extending parallel to main faces of the structure, along one interface selected from the at least two separation interfaces, the method comprising:
  before separating the at least two substrates, damaging at least one portion of a peripheral region of the one interface such that a rupture energy in the at least one portion of the peripheral region is lower than a rupture energy of other interface regions of the at least two separation interfaces;
  partially parting the at least two substrates along the one interface in the damaged region; and
  applying a fluid in a space between the partially parted at least two substrates and decreasing the rupture energy of the one interface by stress corrosion involving breaking of siloxane bonds present at the one interface.

2. The method of claim 1, wherein the peripheral region of the one interface is in the form of a ring.

3. The method of claim 1, wherein the damaging of the at least one portion of the peripheral region of the one interface in an insertion region is performed prior to assembly of the at least two substrates to form the structure.

4. The method of claim 3, wherein the damaging of the at least one portion of the peripheral region is performed by laser irradiation of the one interface.

5. The method of claim 3, wherein the damaging of the at least one portion of the peripheral region is performed by chemical etching of the one interface.

6. The method of claim 1, wherein the damaging of the at least one portion of the peripheral region of the one interface is performed after assembly of the at least two substrates to form the structure.

7. The method of claim 6, wherein the damaging of the at least one portion of the peripheral region is performed by laser irradiation of the one interface.

8. The method of claim 6, wherein the damaging of the at least one portion of the peripheral region is performed by chemical etching of the one interface.

9. The method of claim 1, wherein the damaging of the at least one portion of the peripheral region is performed by laser irradiation of the one interface.

10. The method of claim 1, wherein the damaging of the at least one portion of the peripheral region is performed by chemical etching of the one interface.

11. The method of claim 10, wherein the chemical etching is carried out by applying hydrofluoric acid to the at least one portion of the peripheral region.

12. The method of claim 1, wherein the structure comprises a semiconductor-on-insulator structure including a support substrate, a buried silicon oxide layer and a silicon layer, and wherein the one interface comprises an interface between the oxide layer and the silicon layer.

13. The method of claim 1, wherein the rupture energy of each of the at least two separation interfaces is greater than 1 $J/m^2$ before partially parting the at least two substrates along the one interface in the damaged region.

14. The method of claim 13, wherein the rupture energy of each of the at least two separation interfaces is greater than 1.5 $J/m^2$ before partially parting the at least two substrates along the one interface in the damaged region.

15. The method of claim 14, wherein the rupture energy in the peripheral region of the one interface is less than or equal to 1 $J/m^2$ at the time of the partially parting of the at least two substrates along the one interface in the damaged region.

16. The method of claim 1, wherein the rupture energy in the peripheral region of the one interface is less than or equal to 1 $J/m^2$ at the time of the partially parting of the at least two substrates along the one interface in the damaged region.

17. The method of claim 16, wherein the rupture energy in a remainder of the one interface outside the peripheral region of the one interface is greater than or equal to 1 $J/m^2$ at the time of the partially parting of the at least two substrates along the one interface in the damaged region.

18. The method of claim 17, wherein the rupture energy in the remainder of the one interface outside the peripheral region of the one interface is greater than or equal to 1.5 $J/m^2$ at the time of the partially parting of the at least two substrates along the one interface in the damaged region.

19. The method of claim 1, wherein the fluid applied in the space between the partially parted at least two substrates is selected from the group consisting of deionized water, ethanol, water vapor, aqueous ammonia and hydrazine.

20. The method of claim 1, wherein the partially parting of the at least two substrates along the one interface in the damaged region comprises inserting a blade into the structure along the one interface in the damaged region between the at least two substrates, and wherein applying the fluid in the space between the partially parted at least two substrates comprises applying the fluid in the space while the blade remains inserted between the at least two substrates.

* * * * *